(12) United States Patent
Danilovic et al.

(10) Patent No.: US 10,707,693 B2
(45) Date of Patent: Jul. 7, 2020

(54) WIRELESS POWER SYSTEMS HAVING INTERLEAVED RECTIFIERS

(71) Applicant: WiTricity Corporation, Watertown, MA (US)

(72) Inventors: Milisav Danilovic, Watertown, MA (US); Andre B. Kurs, Chestnut Hill, MA (US)

(73) Assignee: WiTricity Corporation, Watertown, MA (US)

( * ) Notice: Subject to any disclaimer, the term of this patent is extended or adjusted under 35 U.S.C. 154(b) by 0 days.

(21) Appl. No.: 16/543,090

(22) Filed: Aug. 16, 2019

(65) Prior Publication Data

US 2020/0044477 A1 Feb. 6, 2020

Related U.S. Application Data

(63) Continuation of application No. 15/685,889, filed on Aug. 24, 2017, now Pat. No. 10,418,841.
(Continued)

(51) Int. Cl.
*H01M 10/46* (2006.01)
*H02J 7/02* (2016.01)
(Continued)

(52) U.S. Cl.
CPC .............. *H02J 7/025* (2013.01); *B60L 53/12* (2019.02); *H02J 50/10* (2016.02); *H02J 50/12* (2016.02); *H02M 1/12* (2013.01); *H02M 3/24* (2013.01); *H04B 5/0037* (2013.01); *H02M 7/06* (2013.01); *H02M 2001/007* (2013.01); *H02M 2001/123* (2013.01); *H03H 7/38* (2013.01); *Y02T 10/7005* (2013.01); *Y02T 10/7072* (2013.01);
(Continued)

(58) Field of Classification Search
CPC .. H02J 7/025; H02J 5/005; H02J 50/40; H02J 50/20; H01F 28/14; B60L 11/182
USPC .......................... 320/107, 108, 114; 307/104
See application file for complete search history.

(56) References Cited

U.S. PATENT DOCUMENTS 5,784,269 A 7/1998 Jacobs et al.
6,483,730 B2 11/2002 Johnson, Jr.
(Continued)

FOREIGN PATENT DOCUMENTS

GB 1506633 A 4/1978
JP H11-127580 A 5/1999

OTHER PUBLICATIONS

U.S. Appl. No. 15/685,889, filed Aug. 24, 2017, Wireless Power Systems Having Interleaved Rectifiers, Milisav Danilovic.
(Continued)

*Primary Examiner* — Edward Tso
(74) *Attorney, Agent, or Firm* — Goodwin Procter LLP

(57) ABSTRACT

A wireless power receiver is coupled to an impedance matching network, the impedance matching network having a first node and a second node. Coupled to the first node is a first branch having a first positive reactance and a second branch having a first negative reactance, wherein an absolute value of the first positive reactance is different from an absolute value of the first negative reactance, and coupled to the second node is a third branch having a second positive reactance and a fourth branch having a second negative reactance, wherein an absolute value of the second positive reactance is different from an absolute value of the second negative reactance.

20 Claims, 6 Drawing Sheets

Related U.S. Application Data

(60) Provisional application No. 62/412,595, filed on Oct. 25, 2016, provisional application No. 62/379,042, filed on Aug. 24, 2016.

(51) Int. Cl.

| | | |
|---|---|---|
| *H02J 50/12* | (2016.01) | |
| *B60L 53/12* | (2019.01) | |
| *H02M 1/12* | (2006.01) | |
| *H02M 3/24* | (2006.01) | |
| *H02J 50/10* | (2016.01) | |
| *H04B 5/00* | (2006.01) | |
| *H02M 7/06* | (2006.01) | |
| *H02M 1/00* | (2006.01) | |
| *H03H 7/38* | (2006.01) | |

(52) U.S. Cl.
CPC .......... *Y02T 90/122* (2013.01); *Y02T 90/127* (2013.01); *Y02T 90/14* (2013.01)

(56) References Cited

U.S. PATENT DOCUMENTS

| | | |
|---|---|---|
| 7,276,886 B2 | 10/2007 | Kinder et al. |
| 7,333,349 B2 | 2/2008 | Chang et al. |
| 7,440,300 B2 | 10/2008 | Konishi et al. |
| 7,535,133 B2 | 5/2009 | Perreault et al. |
| 8,830,710 B2 | 9/2014 | Perreault et al. |
| 10,418,841 B2* | 9/2019 | Danilovic ............... H02M 3/24 |
| 2003/0169027 A1 | 9/2003 | Croce et al. |
| 2007/0064457 A1 | 3/2007 | Perreault et al. |
| 2008/0265995 A1 | 10/2008 | Okamoto et al. |
| 2011/0116290 A1 | 5/2011 | Boys |
| 2014/0049118 A1 | 2/2014 | Karalis et al. |
| 2015/0357826 A1 | 12/2015 | Yoo et al. |
| 2016/0218566 A1 | 7/2016 | Bunsen et al. |
| 2017/0126069 A1 | 5/2017 | Martin |
| 2017/0256991 A1 | 9/2017 | Bronson et al. |
| 2017/0324351 A1 | 11/2017 | Rochford |
| 2018/0006566 A1 | 1/2018 | Bronson et al. |

OTHER PUBLICATIONS

Rivas et al., Design Considerations for Very High Frequency dc/dc Converters, 37th IEEE Power Electronics Specialists Conference, Jun. 18-22, 2006, 11 pages, Jeju, Korea.

Rivas et al., New Architectures for Radio-Frequency dc/dc Power Conversion, 2004 35th Annual IEEE Power Electronics Specialists Conference, 2004, 11 pages, Aachen, Germany.

International Search Report, International Application No. PCT/US20178/048481, dated Dec. 6, 2017, together with the Written Opinion of the International Searching Authority, 23 pages.

* cited by examiner

WIRELESS POWER SYSTEMS HAVING INTERLEAVED RECTIFIERS

CROSS-REFERENCE TO RELATED APPLICATIONS

This application is a continuation of U.S. patent application Ser. No. 15/685,889, filed Aug. 24, 2017, entitled "Wireless power systems having interleaved rectifiers," which claims priority to U.S. Provisional Patent Application No. 62/379,042, filed Aug. 24, 2016, entitled, "Wireless power receivers having interleaved rectifiers," and U.S. Provisional Patent Application No. 62/412,595, filed Oct. 25, 2016, entitled, "Wireless power receivers having interleaved rectifiers," the disclosures of which are incorporated herein, in their entirety, by reference.

TECHNICAL FIELD

The disclosure generally relates to wireless power systems and, more particularly, the disclosure relates to rectifiers for wireless power receivers in wireless power systems.

BACKGROUND

Wireless power systems can be used to charge batteries having large voltage ranges. A major challenge in efficiently transmitting power from a wireless power transmitter to a receiver is the range of impedances that need to be matched to respond to the large voltage range. Further, in practical wireless power systems, there is a significant amount of harmonic content related to the fundamental frequency of the oscillating energy in the receiver of the wireless power system.

SUMMARY

In accordance with one embodiment, a wireless power receiver includes a receiver resonator coupled to an impedance matching network, the impedance matching network having a first node and a second node. Coupled to the first node is a first branch having a first positive reactance and a second branch having a first negative reactance, wherein an absolute value of the first positive reactance is different from an absolute value of the first negative reactance, and coupled to the second node is a third branch having a second positive reactance and a fourth branch having a second negative reactance, wherein an absolute value of the second positive reactance is different from an absolute value of the second negative reactance. The receiver further includes a first rectifier having a first rectifier input coupled to the first branch, a second rectifier having a second rectifier input coupled to the second branch, a third rectifier having a third rectifier input coupled to the third branch, and a fourth rectifier having a fourth rectifier input coupled to the fourth branch.

In a related embodiment, the absolute value of the first negative reactance is at least 4% different than the absolute value of the first positive reactance and the absolute value of the second negative reactance is at least 4% different than the absolute value of the second positive reactance. Optionally, the absolute value of the first negative reactance is at least 10% different than the absolute value of the first positive reactance and the absolute value of the second negative reactance is at least 10% different than the absolute value of the second positive reactance. Optionally, the absolute value of the first negative reactance is at least 20% different than the absolute value of the first positive reactance and the absolute value of the second negative reactance is at least 20% different than of the absolute value of the second positive reactance.

In another related embodiment, during reception of electromagnetic energy by the wireless power receiver, a first current is formed in the first branch and a second current is formed in the second branch, wherein a magnitude of the first current is within 30% of a magnitude of the second current, and a third current is formed in the third branch and a fourth current is formed in the fourth branch, wherein a magnitude of the third current is within 30% of a magnitude of the fourth current, each of the currents oscillating at a fundamental frequency $f_0$ and at least one harmonic frequency $f_h$ of the fundamental frequency.

In yet another related embodiment, the receiver is configured to deliver power to a battery with a voltage range $V_{low}$ to $V_{high}$, the battery coupled to an output of the first and second rectifiers, and for voltages $V_{low}$ to $0.5(V_{low}+V_{high})$, (i) a magnitude of the first current is within 30% of a magnitude of the second current and (ii) a magnitude of the third current is within 30% of a magnitude of the fourth current. Optionally, the wireless power receiver of claim 4 wherein, for voltage $V_{low}$, the magnitude of the first current is within 10% of the magnitude of the second current and the magnitude of the third current is within 10% of the magnitude of the fourth current.

In a related embodiment, each rectifier has a positive output and a negative output, the positive outputs of the rectifiers joined to form a first output node and the negative outputs of the rectifiers are joined to form a second output node. Optionally, the first output node and second output node are coupled to a single load. In another related embodiment, the first output node and the second output node are coupled to a smoothing capacitor, the smoothing capacitor configured to be coupled in parallel with a load.

In another related embodiment, the impedance matching network includes a first tunable element coupled to the first node and a second tunable element coupled to the second node, so that the wireless power receiver can accommodate a range of the fundamental frequency $f_0$. Optionally, the first tunable element and second tunable element each comprise a tunable capacitor.

In a related embodiment, each of the first, second, third, and fourth rectifiers is a half bridge rectifier. Optionally, the first rectifier and the third rectifier are coupled to form a full bridge rectifier, and the second and fourth rectifiers are coupled to form a full bridge rectifier. Optionally, the first, second, third, and fourth rectifiers are either diode rectifiers or switching rectifiers.

In another related embodiment, the first branch and the third branch each comprise a first inductor and a first capacitor, an absolute value of a reactance value of the first inductor being greater than an absolute value of a reactance value of first capacitance. Optionally, the second branch and the fourth branch each comprise a second inductor and a second capacitor, an absolute value of a reactance value of the second inductor being less than an absolute value of a reactance value of the second capacitor.

In yet another related embodiment, an inductance value of the first inductor is approximately equal to an inductance value of the second inductor. Optionally, the fundamental frequency $f_0$ is 85 kHz. Optionally, or alternatively, the fundamental frequency $f_0$ is 6.78 MHz.

In accordance with another embodiment, a vehicle charging system includes a wireless power receiver having a receiver resonator coupled to an impedance matching network, the impedance matching network having a first node and a second node. Coupled to the first node is a first branch having a first positive reactance and a second branch comprising a first negative reactance, wherein an absolute value of the first positive reactance is different from an absolute value of the first negative reactance, and coupled to the second node is a third branch having a second positive reactance and a fourth branch having a second negative reactance, wherein an absolute value of the second positive reactance is different from an absolute value of the second negative reactance. The receiver further includes a first rectifier having a first rectifier input coupled to the first branch, a second rectifier having a second rectifier input coupled to the second branch, a third rectifier having a third rectifier input coupled to the third branch, and a fourth rectifier having a fourth rectifier input coupled to the fourth branch. The vehicle charger system further includes a vehicle battery coupled to a first output node and a second output node, the first output node formed from an output of the first rectifier and an output of the third rectifier and the second output node is formed from an output of the second rectifier and an output of the fourth rectifier.

In a related embodiment, the absolute value of the first negative reactance is at least 4% different than the absolute value of the first positive reactance and the absolute value of the second negative reactance is at least 4% different than the absolute value of the second positive reactance. Optionally, the absolute value of the first negative reactance is at least 10% different than the absolute value of the first positive reactance and the absolute value of the second negative reactance is at least 10% different than the absolute value of the second positive reactance. Optionally, the absolute value of the first negative reactance is at least 20% different than the absolute value of the first positive reactance and the absolute value of the second negative reactance is at least 20% different than of the absolute value of the second positive reactance.

In another related embodiment, during reception of electromagnetic energy by the wireless power receiver, a first current is formed in the first branch and a second current is formed in the second branch, wherein a magnitude of the first current is within 30% of a magnitude of the second current, and a third current is formed in the third branch and a fourth current is formed in the fourth branch, wherein a magnitude of the third current is within 30% of a magnitude of the fourth current, each of the currents oscillating at a fundamental frequency $f_0$ and at least one harmonic frequency $f_h$ of the fundamental frequency.

In yet another related embodiment, the receiver is configured to deliver power to a battery with a voltage range $V_{low}$ to $V_{high}$, the battery coupled to an output of the first and second rectifiers, and for voltages $V_{low}$ to $0.5(V_{low}+V_{high})$, (i) a magnitude of the first current is within 30% of a magnitude of the second current and (ii) a magnitude of the third current is within 30% of a magnitude of the fourth current. Optionally, the wireless power receiver of claim 4 wherein, for voltage $V_{low}$, the magnitude of the first current is within 10% of the magnitude of the second current and the magnitude of the third current is within 10% of the magnitude of the fourth current.

In a related embodiment, each rectifier has a positive output and a negative output, the positive outputs of the rectifiers joined to form a first output node and the negative outputs of the rectifiers are joined to form a second output node. Optionally, the first output node and second output node are coupled to a single load. In another related embodiment, the first output node and the second output node are coupled to a smoothing capacitor, the smoothing capacitor configured to be coupled in parallel with a load.

In another related embodiment, the impedance matching network includes a first tunable element coupled to the first node and a second tunable element coupled to the second node, so that the wireless power receiver can accommodate a range of the fundamental frequency $f_0$. Optionally, the first tunable element and second tunable element each comprise a tunable capacitor.

In a related embodiment, each of the first, second, third, and fourth rectifiers is a half bridge rectifier. Optionally, the first rectifier and the third rectifier are coupled to form a full bridge rectifier, and the second and fourth rectifiers are coupled to form a full bridge rectifier. Optionally, the first, second, third, and fourth rectifiers are either diode rectifiers or switching rectifiers.

In another related embodiment, the first branch and the third branch each comprise a first inductor and a first capacitor, an absolute value of a reactance value of the first inductor being greater than an absolute value of a reactance value of first capacitance. Optionally, the second branch and the fourth branch each comprise a second inductor and a second capacitor, an absolute value of a reactance value of the second inductor being less than an absolute value of a reactance value of the second capacitor.

In yet another related embodiment, an inductance value of the first inductor is approximately equal to an inductance value of the second inductor. Optionally, the fundamental frequency $f_0$ is 85 kHz. Optionally, or alternatively, the fundamental frequency $f_0$ is 6.78 MHz.

BRIEF DESCRIPTION OF THE DRAWINGS

Those skilled in the art should more fully appreciate advantages of various embodiments from the following "Detailed Description," discussed with reference to the drawings summarized immediately below.

DETAILED DESCRIPTION

In illustrative embodiments, wireless power systems include receivers having interleaved rectifiers. Further, these wireless power receivers include components that efficiently couple energy from a receiving element to the load. A rectifier is typically required for loads requiring direct current or constant voltage. Interleaved rectifiers can have multiple benefits in wireless power systems, as detailed below. Some of these benefits include (i) the reduction of the range of load impedances that a wireless power system experiences; (ii) improvement to efficiency at full and reduced power levels transmitted by the wireless power transmitter; (iii) easier system control when the transmitter is detuned; (iv) maintenance or reduction in footprint of components in wireless power system as compared to those without; (v) improvement to efficiency over a wide range of battery voltages; and/or (vi) reduction of stress on rectifier components. Details of illustrative embodiments are discussed below.

Figure 1:
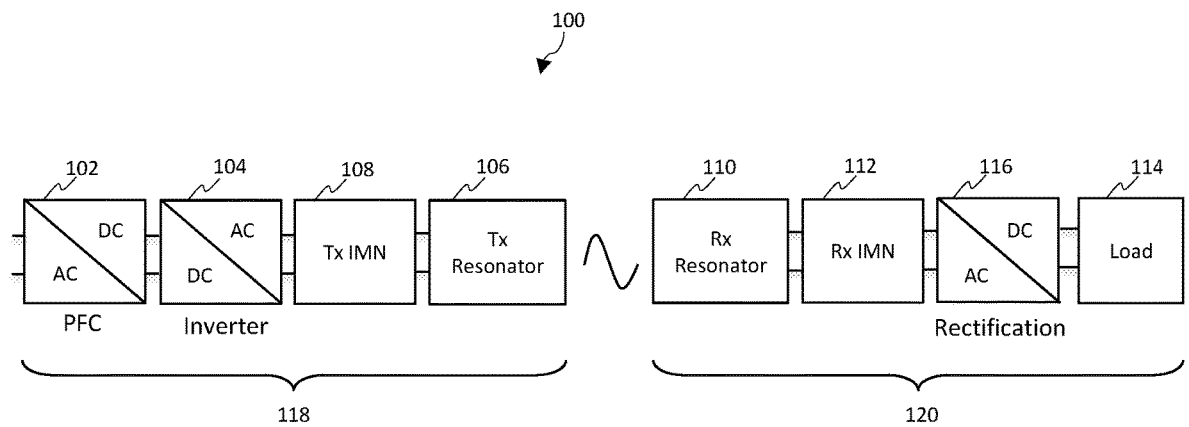
FIG. 1 is a diagram of an exemplary wireless power system including a wireless power receiver having an interleaved rectifier.

FIG. 1 shows a high level functional block diagram of an exemplary embodiment of a wireless power system 100 including a wireless power receiver having an interleaved rectifier, as described more fully below. Input power to the system can be provided by wall power (AC mains), for example, which is converted to DC in an AC/DC converter block 102. Alternatively, a DC voltage can be provided directly from a battery or other DC supply. In some embodiments, the AC/DC converter block 102 may be a power factor correction (PFC) stage. The PFC, in addition to converting the AC input (for example, at 50 or 60 Hz) to DC, can condition the current such that the current is substantially in phase with the voltage. A high-efficiency switching inverter or amplifier 104 converts the DC voltage into an AC voltage waveform used to drive a transmitter resonator 106. In some embodiments, the frequency of the AC voltage waveform may be in the range of 80 to 90 kHz. In some embodiments, the frequency of the AC voltage waveform may be in the range of 10 kHz to 15 MHz. In one particular embodiment, the frequency of the AC voltage waveform is about 6.78 MHz that may vary within a 15 kHz band due to FCC and CISPR regulations. These exemplary frequencies may be termed as an "operating frequency" of the wireless power system.

In the exemplary system 100, a transmitter impedance matching network (Tx IMN) 108 efficiently couples the inverter 104 output to the transmitter resonator 106 and can enable efficient switching-amplifier operation. Class D or E switching amplifiers are suitable in many applications and can require an inductive load impedance for highest efficiency. The Tx IMN 108 transforms the transmitter resonator impedance into such an impedance for the inverter 104. The transmitter resonator impedance can be, for example, loaded by coupling to a receiver resonator 110 and/or output load. The magnetic field generated by the transmitter resonator 106 couples to the receiver resonator 110, thereby inducing a voltage in receiver resonator 110. This energy can be coupled out of the receiver resonator 110 to, for example, directly power a load or charge a battery. A receiver impedance matching network (IMN) 112 can be used to efficiently couple energy from the receiver resonator 110 to a load 114 and optimize power transfer between transmitter resonator 106 and receiver resonator 110. It may transform the actual load impedance into an effective load impedance seen by the receiver resonator 110 which more closely matches the loading for optimum efficiency. For loads requiring direct current or constant voltage (also known as DC voltage), a rectifier 116 converts the received AC power into DC. In embodiments, the transmitter 118 and receiver 120 can each further include filters, sensors, and other components.

The impedance matching networks (IMNs) 108, 112 can be designed to maximize the power delivered to the load 114 at a desired frequency (e.g., 80-90 kHz, 100-200 kHz, 6.78 MHz) or to maximize power transfer efficiency. The impedance matching components in the IMNs 108, 112 can be chosen and connected so as to preserve a high-quality factor (Q) value of resonators 106, 110.

The IMNs' (108, 112) components can include, for example, a capacitor or networks of capacitors, an inductor or networks of inductors, or various combinations of capacitors, inductors, diodes, switches, and resistors. The components of the IMNs can be adjustable and/or variable and can be controlled to affect the efficiency and operating point of the system. Impedance matching can be modified by varying capacitance, varying inductance, controlling the connection point of the resonator, adjusting the permeability of a magnetic material, controlling a bias field, adjusting the frequency of excitation, and the like. It is understood that a system with fixed matching (e.g., fixed inductance, capacitance, etc.) with fixed frequency, fixed input voltage, etc., can achieve impedance matching at some operating conditions. Varying frequency, input voltage, or components' effective value can change the matching and/or the output. The impedance matching can use or include any number or combination of varactors, varactor arrays, switched elements, capacitor banks, switched and tunable elements, reverse bias diodes, air gap capacitors, compression capacitors, barium zirconium titanate (BZT) electrically tuned capacitors, microelectromechanical systems (MEMS)-tunable capacitors, voltage variable dielectrics, transformer coupled tuning circuits, and the like. The variable components can be mechanically tuned, thermally tuned, electrically tuned, piezo-electrically tuned, and the like. Elements of the impedance matching can be silicon devices, gallium nitride devices, silicon carbide devices, and the like. The elements can be chosen to withstand high currents, high voltages, high powers, or any combination of current, voltage, and power. The elements can be chosen to be high-Q elements.

It is understood that the transmitter and/or receiver impedance matching networks (IMNs) can have a wide range of circuit implementations with various components having impedances to meet the needs of a particular application. U.S. Pat. No. 8,461,719 to Kesler et al., which is incorporated herein by reference, discloses a variety of tunable impedance networks, such as in FIGS. 28a-37b, for example. It is further understood that any practical number of switched capacitors can be used on the source and/or device side to provide desired operating characteristics.

Figure 2:
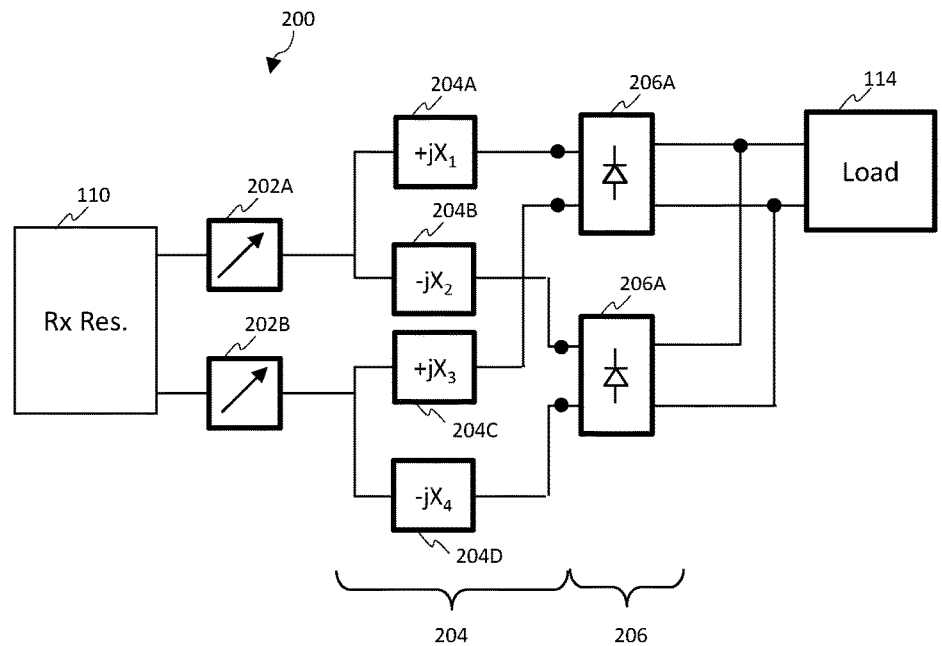
FIG. 2 is a diagram of an exemplary circuit implementation of a wireless power receiver having an interleaved rectifier.

FIG. 2 shows a block diagram of an exemplary embodiment of a wireless power receiver having an interleaved rectifier. The receiver includes a resonator 110 coupled to an impedance matching network (IMN) having balanced electronic components 202A, 202B. In some embodiments, these electronic components 202A, 202B can include tunable capacitors and/or inductors. These components are connected to a first stage 204 of the interleaved rectifier having balanced electronic components.

Balancing components can be important to reject any common-mode signal that may be present due to, for example, perturbations of driving circuitry. Note that each of the top branches (204A and 204C) has positive reactance +$jX_1$ and +$jX_3$ and each of the bottom branches (204B and 204D) has negative reactance $-jX_2$ and $-jX_4$. The positive reactance +$jX$ ($-jX_1$, +$jX_3$) branches 204A, 204C of the first stage 204 are connected to a first rectifier 206A of the second stage 206 of the interleaved rectifier. The negative reactance $-jX$ ($-jX_2$, $-jX_4$) branches 204B, 204D of the second stage 204 are connected to a second rectifier 206B of the second stage 206 of the interleaved rectifier. Note that, in some embodiments, the absolute value of positive and negative reactance values may be equal to one another. In other embodiments, the absolute value of the positive reactance may be greater or less than the absolute value of the negative reactance. The outputs of these rectifiers 206A, 206B are added together, as more fully described below, to connect to the load 114, such as a battery or battery manager. Note that an effect of the "interleaved rectification" is the advantageous recombining of rectified signals that can potentially be out of phase with respect to one another. This can lead to a smoothing effect on the combined signal output.

In some exemplary wireless power systems, a switching inverter 104 can generate an alternating current or oscillating voltage at one or more harmonic frequencies $f_h$ of the fundamental frequency $f_0$, in addition to the fundamental frequency $f_0$ itself. Energy at one or more harmonic frequencies $f_h$, in addition to the fundamental frequency $f_0$, propagates from the transmitter to the receiver. For example, for an operating frequency of 85 kHz, the current induced in the receiver by the transmitter oscillates at frequency $f_0$=85 kHz and harmonic frequencies $f_{h1}$=170 kHz, $f_{h2}$=255 kHz, $f_{h3}$=340 kHz, etc. In some exemplary systems, the components within the receiver can cause energy oscillating at harmonic frequencies $f_h$ to propagate within the receiver. In some embodiments, the propagation of energy at these harmonic frequencies $f_h$ (in addition to the fundamental frequency $f_0$) can cause the components of the receiver to behave unexpectedly as compared to operating solely at the fundamental frequency $f_0$. For example, components such as inductors and capacitors in the receiver may be selected to have a certain impedance during operation at the fundamental frequency $f_0$=85 kHz but may present significantly different impedance when the circuit is carrying currents at $f_{h1}$=170 kHz (and/or other harmonics) in addition to the fundamental frequency $f_0$=85 kHz. Thus, it is advantageous for the components of the receiver to be tuned such that the impedance in the receiver circuit is properly matched and the transmitter is presented with an expected reflected impedance.

In an exemplary embodiment, to address the above challenge, the reactive components can be imbalanced to mitigate an impedance mismatch due to harmonic content. In other words, the reactance $X_1$ of positive reactance branch +$jX_1$ can be configured to differ from the reactance $X_2$ in the negative reactance branch $-jX_2$. Hence, in the exemplary configuration shown in FIG. 2, the reactances would be configured as follows:

$$X_1 \neq X_2$$

$$X_3 \neq X_4.$$

In some embodiments, the difference between $X_1$ and $X_2$ may be at least 4% of the higher of $X_1$ and $X_2$. In other embodiments, the difference between $X_1$ and $X_2$ may be at least 1% of the higher of $X_1$ and $X_2$. In yet other embodiments, the difference between $X_1$ and $X_2$ may be at least 5% of the higher of $X_1$ and $X_2$. Note that these ranges can apply to the differences between $X_3$ and $X_4$. In some embodiments, the difference $d(X_1, X_2)$ between $X_1$ and $X_2$ is approximately the same as the difference $d(X_3, X_4)$ between $X_3$ and $X_4$:

$$d(X_1, X_2) \approx d(X_3, X_4).$$

The unbalanced reactances lead to better balanced currents through the branches of the receiver during the operation of the wireless power system. Another significant advantage to the above described configuration is the reduction of the peak current in the inductors within the receiver, namely the inductors within the interleaved rectifier. The reduction in the peak current also mitigates any thermal issues that can arise from large currents in the inductors and/or other components of the receiver.

Figure 3:
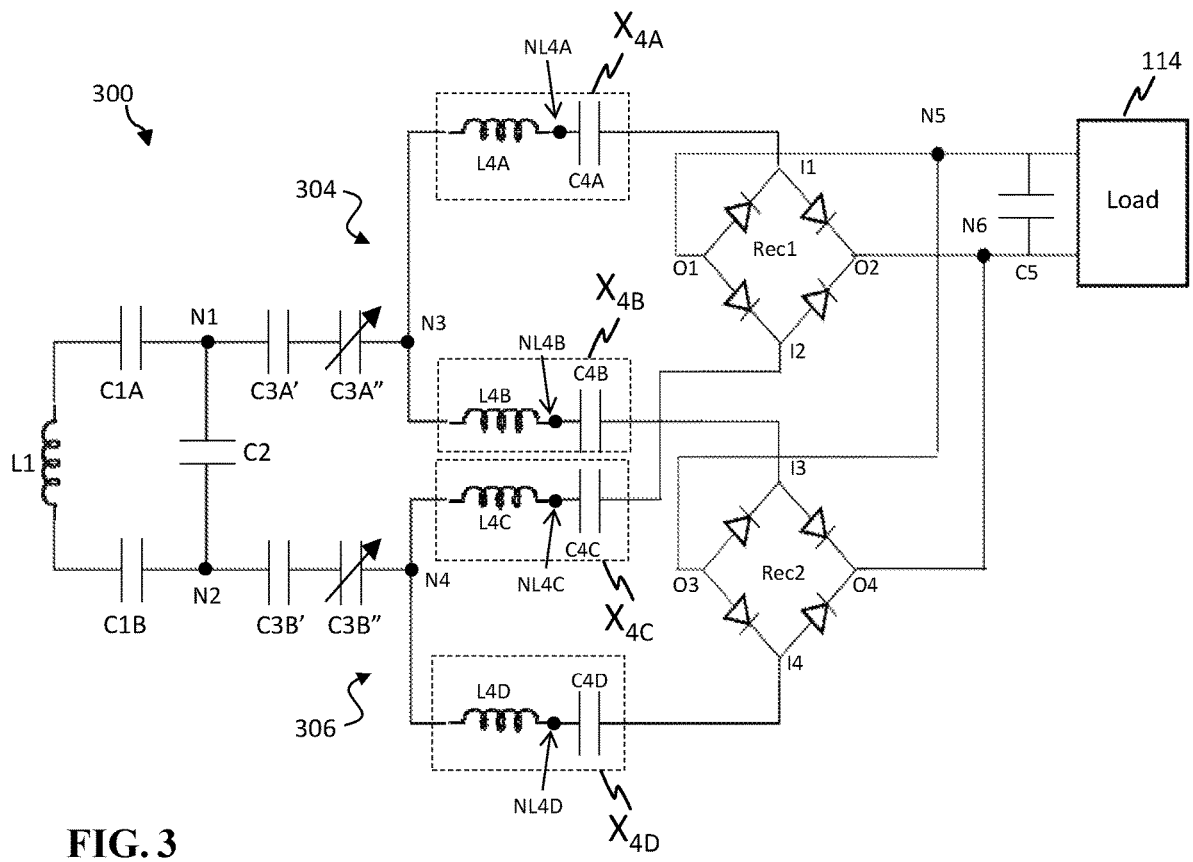
FIG. 3 is a schematic of an exemplary circuit implementation of a wireless power receiver having an interleaved rectifier.

FIG. 3 is a schematic diagram of an exemplary embodiment of a wireless power receiver having an interleaved rectifier. The receiver includes an inductor L1 connected in series to a capacitor C1A and capacitor C1B and connected in parallel to a capacitor C2. Connected to each of nodes N1 and N2 are fixed capacitor C3A' connected in series to a tunable capacitor C3A" and fixed capacitor C3B' connected in series to capacitor C3B" (see examples above for tunable capacitors). Note that one or more components on the top branch are balanced with one or more components of same or similar value on the bottom branch. For example, capacitor C1A is balanced with capacitor C1B. Connected to node N3 is a top portion 304 that includes a first branch and second branch. The first branch includes an inductor L4A connected a capacitor C4A and a second branch including an inductor L4B connected to capacitor C4B. Note that the inductors and capacitors can be connected in series or parallel to one another. In the first branch, to achieve positive reactance, the reactance of the inductor L4A at the operating frequency may be greater than the reactance of capacitor C4A. In the second branch, to achieve negative reactance, the reactance of the inductor L4B at the operating frequency may be less than the reactance of capacitor C4B.

Connected to node N4 is bottom portion 306 that includes a third branch and a fourth branch. The third branch includes an inductor L4C connected to capacitor C4C and a fourth branch including an inductor L4D connected to a capacitor C4D. Note that the inductors and capacitors can be connected in series or parallel to one another. For example, the inductor L4 connected to capacitor C4 in series creates a filter to pass a current with the desired frequency to the input of the rectifier. In the third branch, to achieve positive reactance, the reactance of the inductor L4C at the operating frequency may be greater than the reactance of the capacitor C4C. In the fourth branch, to achieve negative reactance, the reactance of the inductor L4D at the operating frequency may be less than the reactance of the capacitor C4D. Note that any of the inductors L4 and/or capacitances C4 can include tunable components.

The output of first branch is connected to the input I1 of the first rectifier Rec1 and the output of the second branch is connected to the input I2 of Rec1. The output of the third branch is connected to the input I3 of the second rectifier Rec2 and the output of the fourth branch is connected to the input I4 of Rec2. Note that each of the rectifiers can be a half-bridge, full-bridge, passive (diode) or active (switching) type rectifier. In embodiments, a wireless power system with an output of greater than 10, 15, 20 kW may use a switching rectifier to maintain high efficiency of power to the load. In other words, at certain power levels, a diode rectifier may not be able to operate as efficiently at very high power levels.

Output O3 of rectifier Rec2 is connected at node N5 such that outputs O1 and O3 are electrically added. Output O4 of rectifier Rec2 is connected at node N6 such that outputs O2 and O4 are electrically added. Combined outputs O1+O3 (at node N5) and O2+O4 (at node N6) are connected to a smoothing capacitor C5. Connected in parallel to the smoothing capacitor C5 is a load 114, such as a battery or battery manager. Note that the configuration of the rectifiers Red 1 and Rec2 are presented as two full bridge rectifiers in FIG. 3. This two full bridge rectifier configuration is electrically equivalent to four half bridge rectifiers depicted in FIG. 4. In other words, a pair (2) of half bridge rectifiers can be coupled together to form a full bridge rectifier configuration.

Figure 4:
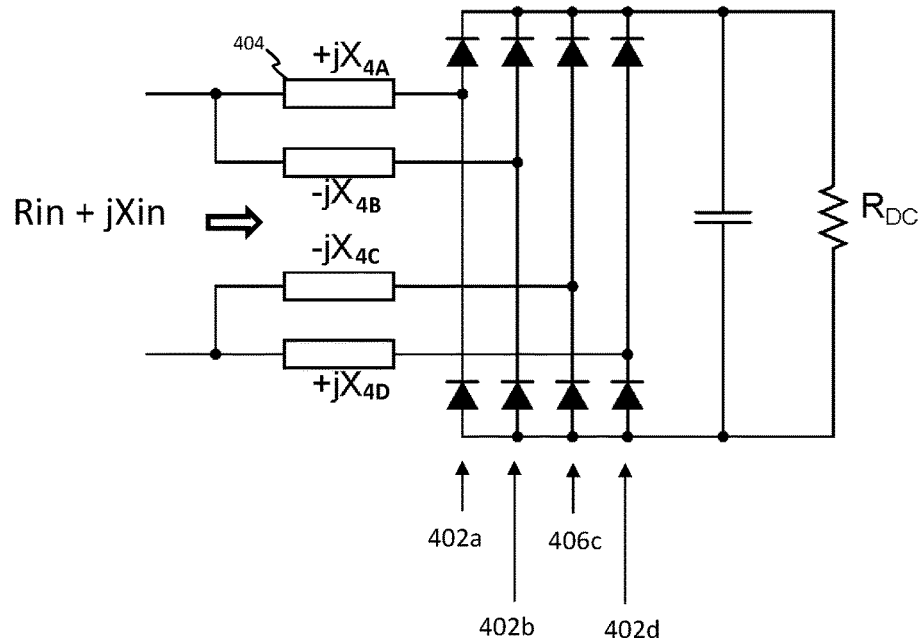
FIG. 4 is a schematic of an exemplary embodiment of a portion of a wireless power receiver having an interleaved rectifier.

FIG. 4 is a diagram of an exemplary embodiment of a portion of a wireless power receiver having an interleaved rectifier. The impedance $Z_{IN}=R_{IN}$ seen at the input of the interleaved rectifier is a function of the load impedance $Z_{DC}=R_{DC}$ and a characteristic impedance, X. In the example shown in FIG. 4, reactance $X_{4A}=X_{4C}=X$ and $X_{4B}=X_{4D}=-X$ The input impedance to the rectifier, as a function of load impedance, has a minimum value when the load impedance is equal to $X*(\pi^2/8)$, and increases for smaller and larger load impedances. If the characteristic impedance, X, is chosen such that $X*(\pi^2/8)$ is between the minimum and maximum load impedances, for example, chosen near the midpoint, then the input impedance can vary over a smaller range than the output impedance. In the example, the minimum and maximum load impedances are denoted by the minimum and maximum battery voltage markers 280 V and 450 V. This is a significant benefit of the interleaved rectifier—it can reduce the range of impedances seen by the circuit coupled to the interleaved rectifier. Note that, in some embodiments, each of the diode configurations 402a, 402b, 402c, and 402d can be operated as half-bridge rectifiers.

Below is the relationship of the input impedance as a function of load impedance for an ideal resistance compressor.

$$R_{IN} = \frac{\left(\frac{8}{\pi^2}R_{DC}\right)^2 + X^2}{\frac{8}{\pi^2}R_{DC}}$$

For wireless power receivers that are integrated into products such as vehicles, robots, medical devices, mobile electronic devices, etc., it is highly desirable for the size, weight, or cost of the inductor(s) used in the impedance matching network to be minimized. For example, in many applications, the inductors L4A, L4B, L4C, and L4D (see FIG. 3) may take up a large amount of space due to the windings and magnetic material that make up each inductor. Thus, an inductor with a minimum possible value is selected for each of inductors L4A, L4B, L4C, and L4D.

Figure 5A:
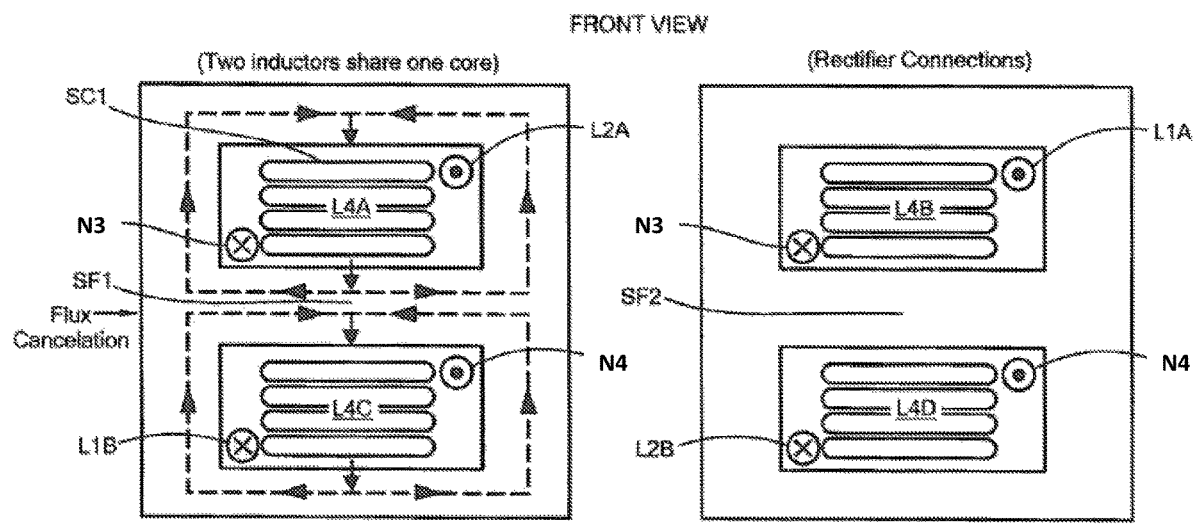
FIG. 5A is a diagram of an exemplary embodiment of integrated inductors that can be used for two or more of inductors L4A, L4B, L4C, and L4D in the matching network of the wireless power receiver.
Figure 5B:
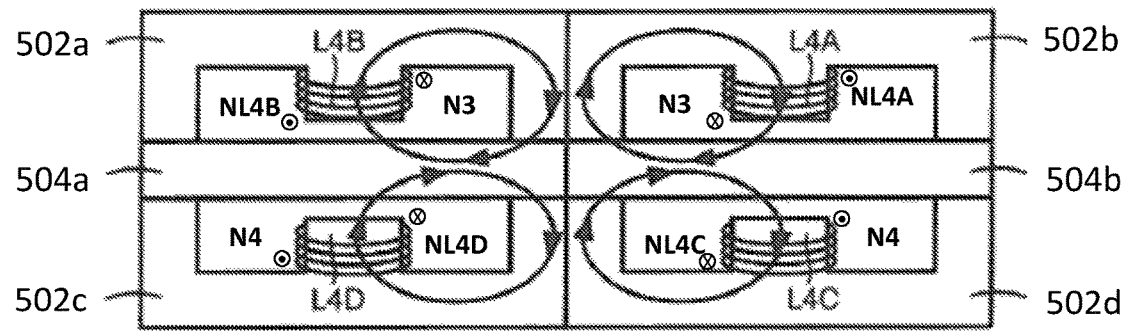
FIG. 5B is a diagram of an exemplary embodiment of integrated inductors that can be used for the four inductors L4A, L4C, L4B, and L4D in the matching network of the wireless power receiver.

In some embodiments, two or more of the inductors L4A, L4B, L4C, and L4D can be integrated into a single structure to further minimize the size, weight, and/or cost of the integrated inductors as compared individual inductors. FIG. 5A is a diagram of an exemplary embodiment of integrated inductors that can be used for two or more of inductors L4A, L4B, L4C, and L4D in the matching network of a wireless power receiver. Inductor L4A and inductor L4C share a core SC1 and share a ferrite layer SF1. In the illustrated embodiment, the flux generated by inductor L4A and inductor L4C is substantially cancelled in the shared ferrite layer SF1 since the flow is in opposite directions. Inductor L4A and inductor L4C are additionally magnetically decoupled. Inductors L4B and L4D, which may share a core, have a similar configuration in which flux in a shared ferrite layer SF2 between them is substantially canceled. Inductor L4B and inductor L4D are additionally magnetically decoupled. It is understood that a variety of winding configurations can produce flux cancellations to meet the needs of a particular application. FIG. 5B is a diagram of an exemplary embodiment of integrated inductors that can be used for the four inductors L4A, L4C, L4B, and L4D in the matching network of the wireless power receiver. FIG. 5B shows an exemplary shared ferrite inductor system having four cores 502a, 502b, 502c, 502d with one or more shared ferrite pieces 504a and 504b and corresponding flux cancellation, as shown. It is understood that a variety of winding configurations can produce multiple flux cancellations to meet the needs of a particular application. The four inductors L4A, L4B, L4C, and L4D are not significantly magnetically coupled since the shared portions of ferrite effectively prevents flux linked by one inductor from being linked by the other. Examples of integrated inductors can be found in commonly owned U.S. patent application Ser. No. 15/671,680 filed Aug. 8, 2017 and titled "Inductor system having shared material for flux cancellation".

EXAMPLES

The following are examples that illustrate the benefits of wireless power receivers having compensated reactance within an interleaved rectifier. Examples 1A-1C describe embodiments of a wireless power system with the following specifications. The wireless power system is configured to transmit power of approximately 10 kW to the load at an operating frequency of 85 kHz (the fundamental frequency $f_0$). Due to the square waveform produced by the switching inverter of the wireless power transmitter, currents and/or voltages at frequencies other than the fundamental frequency $f_0$ are introduced to the system. For example, energy having at least one harmonic frequency $f_h$ of the fundamental frequency $f_0$ are received by the wireless power receiver. The presence of frequencies in the system other than the fundamental frequency results in impedance values other than what is expected. Note that reactance X of the receiver is defined by the following relationship:

$$X = \omega L - \frac{1}{\omega C}$$

The load, in Examples 1A-1C, can be one or more batteries having an overall voltage range $V_{batt}$ of 280 V to 420 V.

Example 1A

For a battery voltage $V_{batt}$ of 280 V, the following table outlines the values of associated with the components of an exemplary wireless power receiver 300. The expected impedance Z of each of the top and bottom portions 304, 306 is 6.35+j9.53 Ohms. In some embodiments, the input voltage Vin may be adjusted to keep the input power Pin constant.

The resistances of each of the branches of the interleaved rectifier can be determined by circuit simulations. In this particular example, the expected resistances $R_{4A}$, $R_{4B}$, $R_{4C}$, and $R_{4D}$ are each 6.35 Ohms. The expected reactances $X_{4A}$, $X_{4B}$, $X_{4C}$, and $X_{4D}$ are calculated as follows:

$$X_{4A}, X_{4C} = \omega L - \frac{1}{\omega C_{4A,4C}} = 9.53\ \Omega$$

$$X_{4B}, X_{4D} = \omega L - \frac{1}{\omega C_{4B,4D}} = -9.53\ \Omega$$

The currents $I_{4A}$, $I_{4B}$, $I_{4C}$, and $I_{4D}$ in the branches 4A, 4B, 4C and 4D are measured (e.g., by a current sensor) during the operation of the wireless power system. Note that, the currents $I_{4A}$, $I_{4C}$ (group 1) are approximately equal (to within 1% of the larger of the currents) and currents $I_{4B}$, $I_{4D}$ (group 2) are approximately equal (to within 1% of the larger of the currents). The difference between these two groups of currents, however, can be a result of the difference in the impedance Z of each branch 4A-4D. For example, in an exemplary uncompensated system, the reactance $X_{4A}$ is equal to reactance $X_{4B}$ and reactance $X_{4C}$ is equal to $X_{4D}$. This is also termed as "uncompensated reactances". It is uncompensated in that the reactances are not adjusted (or imbalanced) to account for the current (and/or power) imbalance. Thus, a uncompensated receiver having balanced reactances that receives energy at both fundamental and harmonic frequencies experiences imbalanced currents. A compensated receiver having compensated reactances experiences balanced currents. In a compensated receiver, the net impedance looking into each of the branches 4A, 4B, 4C, and 4D is similar because the physical reactances $X_{4A}$, $X_{4B}$, $X_{4C}$, and $X_{4D}$ have been adjusted such that:

$X_{4A} \neq X_{4B}$ $X_{4C} \neq X_{4D}$.

In some embodiments, these reactances $X_{4A}$, $X_{4B}$, $X_{4C}$, and $X_{4D}$ can be specifically chosen to make the net impedance looking into each of the branches 4A, 4B, 4C, and 4D intentionally negative or positive. In some embodiments, the net impedance may be made to have a specific value or value range. This type of adjustment may have the benefit of accommodating a tunable component in the matching network (shown as 202A or 202B in FIG. 2 or C3A" or C3B" in FIG. 3). For example, if the tunable component can be adjusted in one direction, namely to have more negative or more positive reactance, then configuring the net impedance of the interleaved rectifier in the opposite direction can provide a greater degree of adjustment for the tunable component. Examples of tunable components in wireless power systems can be found in U.S. patent application Ser. No. 15/422,554 filed on Feb. 2, 2017 and titled "Controlling wireless power systems" and U.S. patent application Ser. No. 15/427,186 filed on Feb. 8, 2017 and titled "PWM capacitor control".

The percentage difference in resistance values can be calculated by the determining the ratio of the difference of the resistance values to the higher of the two resistance values, as shown in the following. The percent difference in reactance values can be calculated by determining the ratio of the difference of each of the absolute values of the reactance values to the absolute value of the higher of the two reactance values.

$$\Delta\text{Resistance, } \Delta R = \frac{(R_{4A}, R_{4C}) - (R_{4B}, R_{4D})}{(R_{4A}, R_{4C})}$$

-continued $$\Delta\text{Reactance, } \Delta X = \frac{|(X_{4A}, X_{4C})| - |(X_{4B}, X_{4D})|}{\text{higher of } (|(X_{4A}, X_{4C})|, |(X_{4B}, X_{4D})|)}$$

le;2qIn some embodiments, the absolute value of the reactance $|X_{4B}|$ is at least 4% different than the absolute value of the reactance $|X_{4A}|$ and the absolute value of the reactance $|X_{4D}|$ is at least 4% different than the absolute value of the reactance $|X_{4C}|$. In some embodiments, the absolute value of the reactance $|X_{4B}|$ is at least 10% different than the absolute value of the reactance $|X_{4A}|$ and the absolute value of the reactance $|X_{4D}|$ is at least 10% different than the absolute value of the reactance $|X_{4C}|$. In some embodiments, the absolute value of the reactance $|X_{4B}|$ is at least 20% different than the absolute value of the reactance $|X_{4A}|$ and the absolute value of the reactance $|X_{4D}|$ is at least 20% different than the absolute value of the reactance $|X_{4C}|$.

In the exemplary uncompensated receiver detailed in the table below, the difference between the first group of currents and second group of currents is approximately 20.1%:

$$\Delta\text{Current} = \frac{(I_{4B}, I_{4D}) - (I_{4A}, I_{4C})}{(I_{4B}, I_{4D})} = 0.201 = 20.1\%.$$

Note that in the above formula, the percentage difference is determined as the difference from the higher of the currents.

In contrast, in the exemplary compensated receiver detailed in the table below, the difference between the first group of currents and second group of currents is approximately 0.2%:

$$\Delta\text{Current} = \frac{(I_{4B}, I_{4D}) - (I_{4A}, I_{4C})}{(I_{4B}, I_{4D})} = 0.002 = 0.2\%.$$

The imbalanced current issue present in exemplary uncompensated system described thus far has been in the context of choosing a low inductance value for inductors L4A-L4D. In comparison, in an exemplary uncompensated receiver, an inductor four times the size of minimally-sized inductor L4 may be also used to mitigate the current imbalance. While an inductor this large may be a workable solution in some applications, in many applications, restrictions on size, cost, and weight will be major forces in commercializing a wireless power receiver. In some embodiments, a uncompensated receiver may require anywhere between four to ten times the size of minimally-sized inductor L4 to reduce the current imbalance. The larger an inductor used, the better filtering effect it has on the currents oscillating at harmonic frequencies. However, there is a significant challenge in reducing the size of the inductor(s) while maintaining expected performance.

Note that, in some embodiments, inductance value L4 is the same for all of L4A, L4B, L4C, and L4D. In other words, L4=L4A=L4B=L4C=L4D.

TABLE 1

Characteristics of exemplary uncompensated and compensated wireless power receivers configured to receive energy with fundamental frequency $f_0 = 85$ kHz, at battery voltage $V_{batt} = 280$ V.

| | Uncompensated Receiver $L_4 = 18.12$ uH | Compensated Receiver $L_4 = 18.12$ uH |
|---|---|---|
| Currents $I_{4A}$, $I_{4C}$ (A) | 24.92 | 28.21 |
| Currents $I_{4B}$, $I_{4D}$ (A) | 31.2 | 28.26 |
| Δ Current (%) | 20.1% | 0.2% |
| Net resistance looking into branches $R_{4A, 4C}$ (Ohm) | 7.11 | 6.3 |
| Net reactance looking into branches $X_{4A, 4C}$ (Ohm) | 10.78 | 9.51 |
| Net resistance looking into branches $R_{4B, 4D}$ (Ohm) | 5.7 | 6.26 |
| Net reactance looking into branches $X_{4B, 4D}$ (Ohm) | −8.61 | −9.51 |
| Δ Net Resistance, ΔR (%) | 19.8% | 0.6% |
| Δ Net Reactance, ΔX (%) | 20.1% | 0% |
| Capacitances $C_{4A}$, $C_{4C}$ (nF) | 13095 | 1637 |
| Capacitances $C_{4B}$, $C_{4D}$ (nF) | 97.48 | 92.12 |
| Power $P_{4A} + P_{4C}$ (W) | 4414 | 5012 |
| Power $P_{4B} + P_{4D}$ (W) | 5534 | 5002 |
| Input Power $P_{in}$ (W) | 9948 | 10014 |
| Input resistance $R_{in}$ (Ohm) | 20.25 | 20.7 |
| Input reactance $X_{in}$ (Ohm) | −3.4 | −0.03 |
| Reactance $X_{4A}$, $X_{4C}$ (Ohm) | 9.53 | 8.53 |
| Reactance $X_{4B}$, $X_{4D}$ (Ohm) | −9.53 | −10.65 |
| Δ Reactance, ΔX (%) | 0% | 19.9% |

Figure 6A:
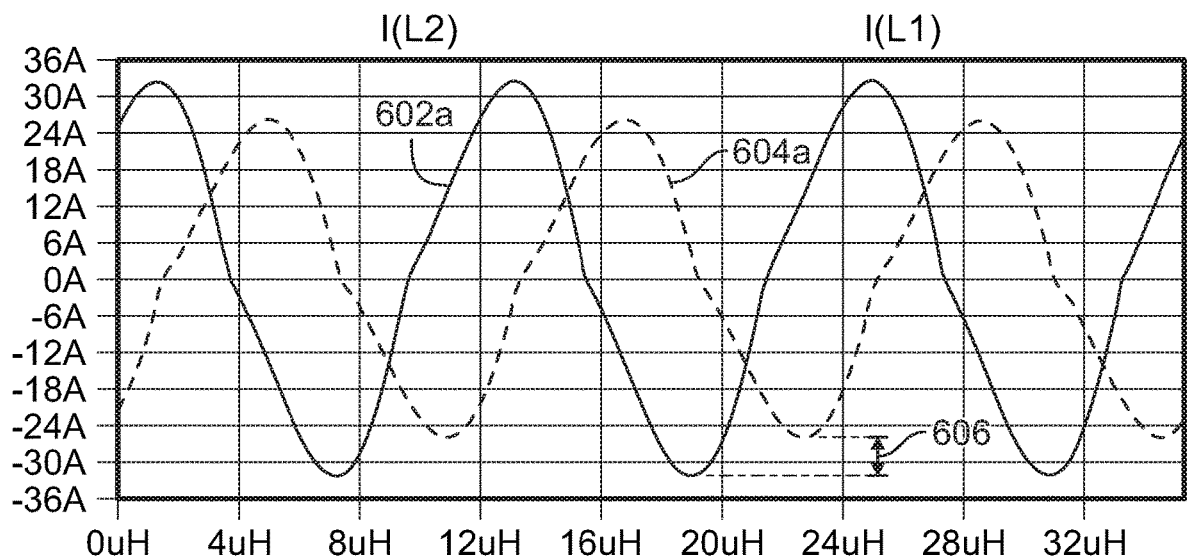
FIG. 6A is a plot of current levels in an impedance matching network having uncompensated reactance in an exemplary wireless power receiver.
Figure 6B:
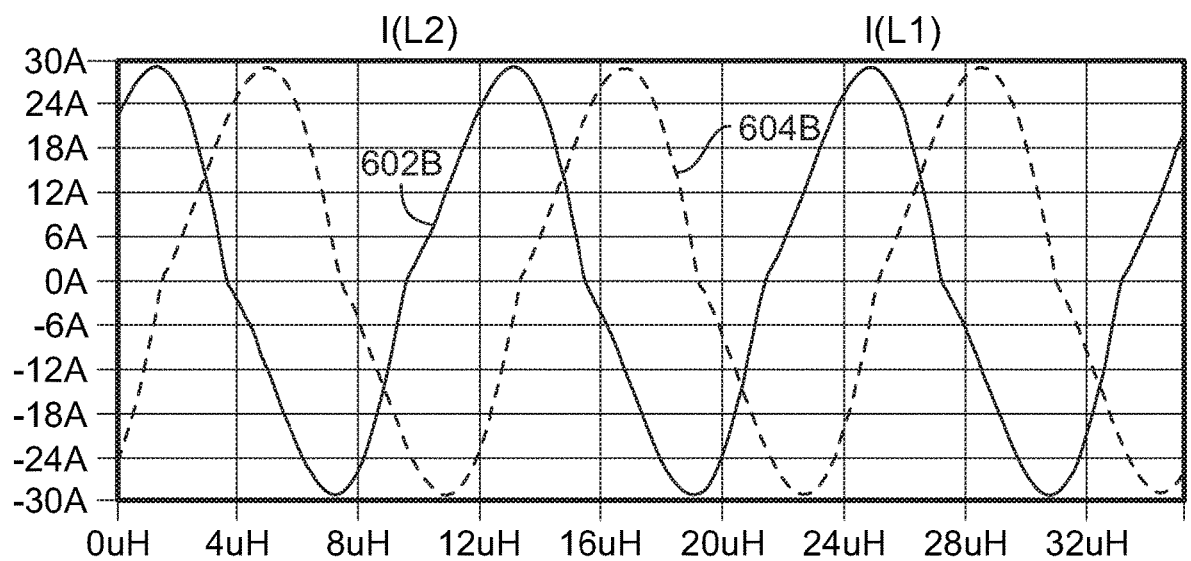
FIG. 6B is a plot of current levels in an impedance matching network having compensated reactance in an exemplary wireless power receiver.

FIG. 6A is a plot of current levels in an impedance matching network having uncompensated reactance in an exemplary wireless power receiver. Line 602a is the current magnitude for $I_{4B}$, $I_{4D}$ as a function of time and line 604a is current magnitude for $I_{4A}$, $I_{4C}$ as a function of time. FIG. 6B is a plot of current levels in an impedance matching network having compensated reactance in an exemplary wireless power receiver. Line 602b is the current magnitude for $I_{4B}$, $I_{4D}$ as a function of time and line 604b is current magnitude for $I_{4A}$, $I_{4C}$ as a function of time. Note that the difference 606 between the magnitude of line 602b and the magnitude of line 604b in FIG. 7A. This difference 606 is notably absent in the current magnitudes 602b, 604b in FIG. 6B and serve to illustrate that the currents become balanced when the reactances are compensated.

Example 1B

For a battery voltage $V_{batt}$ of 350 V, the following table outlines the values of associated with the components of an exemplary wireless power receiver 300. The expected impedance Z of the matching network is 9.93+j9.53 Ohms.

Similar calculations to the previous example, Example 1A, are used here to determine the percent difference in the current, resistance, and impedance values. Note that the above effect of balanced currents (and/or balanced power) in the compensated receiver is less pronounced at this battery voltage level. For example, the percent difference in current levels drops from 41% in a uncompensated receiver to 25.4% in a compensated receiver. A much larger inductor has the effect of reducing the current imbalance to around 12.7% but at a much higher cost (namely, around four times the inductance value of the minimal inductance L4).

TABLE 2

Characteristics of exemplary uncompensated and compensated wireless power receivers configured to receive energy with fundamental frequency $f_0 = 85$ kHz, at battery voltage $V_{batt} = 350$ V.

| | Uncompensated Receiver $L = 18.12$ uH | Compensated Receiver $L = 18.12$ uH |
|---|---|---|
| Input voltage $V_{in}$ (V) | 316 | 315 |
| Currents $I_{4A}$, $I_{4C}$ (A) | 17.1 | 19.7 |
| Currents $I_{4B}$, $I_{4D}$ (A) | 29 | 26.42 |
| Δ Current (%) | 41% | 25.4% |
| Net resistance looking into branches $R_{4A, 4C}$ (Ohm) | 12.44 | 10.94 |
| Net reactance looking into branches $X_{4A, 4C}$ (Ohm) | 13.66 | 11.67 |
| Net resistance looking into branches $R_{4B, 4D}$ (Ohm) | 7.56 | 8.25 |
| Net reactance looking into branches $X_{4B, 4D}$ (Ohm) | −7.87 | −8.62 |
| Δ Net Resistance, ΔR (%) | 39.2% | 24.6% |
| Δ Net Reactance, ΔX (%) | 42.3% | 26.1% |
| Capacitances $C_{4A}$, $C_{4C}$ (nF) | 13095 | 1676 |
| Capacitances $C_{4B}$, $C_{4D}$ (nF) | 97.48 | 94.34 |
| Power $P_{4A} + P_{4C}$ (W) | 3645 | 4253 |
| Power $P_{4B} + P_{4D}$ (W) | 6355 | 5758 |
| Input power $P_{in}$ (W) | 10000 | 10011 |
| Input resistance $R_{in}$ (Ohm) | 18.74 | 19.44 |
| Input reactance $X_{in}$ (Ohm) | −4.88 | −2.88 |
| Reactance $X_{4A}$, $X_{4C}$ (Ohm) | 9.53 | 8.56 |
| Reactance $X_{4B}$, $X_{4D}$ (Ohm) | −9.53 | −10.17 |
| Δ Reactance, ΔX (%) | 0% | 15.8% |

Example 1C

For a battery voltage $V_{batt}$ of 420 V, the following table outlines the values of associated with the components of an exemplary wireless power receiver 300. The expected impedance Z of the matching network is 14.3+j9.53 Ohms.

Similar calculations to Example 1A are used here to determine the percent difference in the current, resistance, and impedance values. Note that the above effect of balanced currents (and/or balanced power) in the compensated receiver is less pronounced at this battery voltage level. For example, the percent difference in current levels drops from 65% in a uncompensated receiver to 53.5% in a compensated receiver. A much larger inductor has the effect of reducing the current imbalance to around 24.5% but at a much higher cost (namely, around four times the inductance value of the minimal inductance L4).

TABLE 3

Characteristics of exemplary uncompensated and compensated wireless power receivers configured to receive energy with a fundamental frequency $f_0 = 85$ kHz, at battery voltage $V_{batt} = 420$ V.

| | Uncompensated Receiver $U = 18.12$ uH | Compensated Receiver $U = 18.12$ uH |
|---|---|---|
| Input voltage $V_{in}$ (V) | 340 | 338 |
| Currents $I_{4A}$, $I_{4C}$ (A) | 10.5 | 12.72 |
| Currents $I_{4B}$, $I_{4D}$ (A) | 29.95 | 27.36 |
| Δ Current (%) | 65% | 53.5% |
| Net resistance looking into branches $R_{4A, 4C}$ (Ohm) | 20.18 | 18.16 |
| Net reactance looking into branches $X_{4A, 4C}$ (Ohm) | 25.32 | 19.35 |
| Net resistance looking into branches $R_{4B, 4D}$ (Ohm) | 8.7 | 9.45 |
| Net reactance looking into branches $X_{4B, 4D}$ (Ohm) | −7.29 | −7.94 |

TABLE 3-continued

Characteristics of exemplary uncompensated and compensated wireless power receivers configured to receive energy with a fundamental frequency $f_0$ = 85 kHz, at battery voltage $V_{batt}$ = 420 V.

|  | Uncompensated Receiver U = 18.12 uH | Compensated Receiver U = 18.12 uH |
|---|---|---|
| Δ Net Resistance, ΔR (%) | 56.9% | 48.1% |
| Δ Net Reactance, ΔX (%) | 71.2% | 59.0% |
| Capacitances $C_{4A}$, $C_{4C}$ (nF) | 13095 | 1676 |
| Capacitances $C_{4B}$, $C_{4D}$ (nF) | 97.48 | 94.34 |
| Power $P_{4A}$ + $P_{4C}$ (W) | 2224 | 2940 |
| Power $P_{4B}$ + $P_{4D}$ (W) | 7800 | 7073 |
| Input power $P_{in}$ (W) | 10024 | 10013 |
| Input resistance $R_{in}$ (Ohm) | 20.22 | 21.1 |
| Input reactance $X_{in}$ (Ohm) | −7.56 | −5.92 |
| Reactance $X_{4A}$, $X_{4C}$ (Ohm) | 9.53 | 8.56 |
| Reactance $X_{4B}$, $X_{4D}$ (Ohm) | −9.53 | −10.17 |
| Δ Reactance, ΔX (%) | 0% | 15.8% |

Figure 7A:
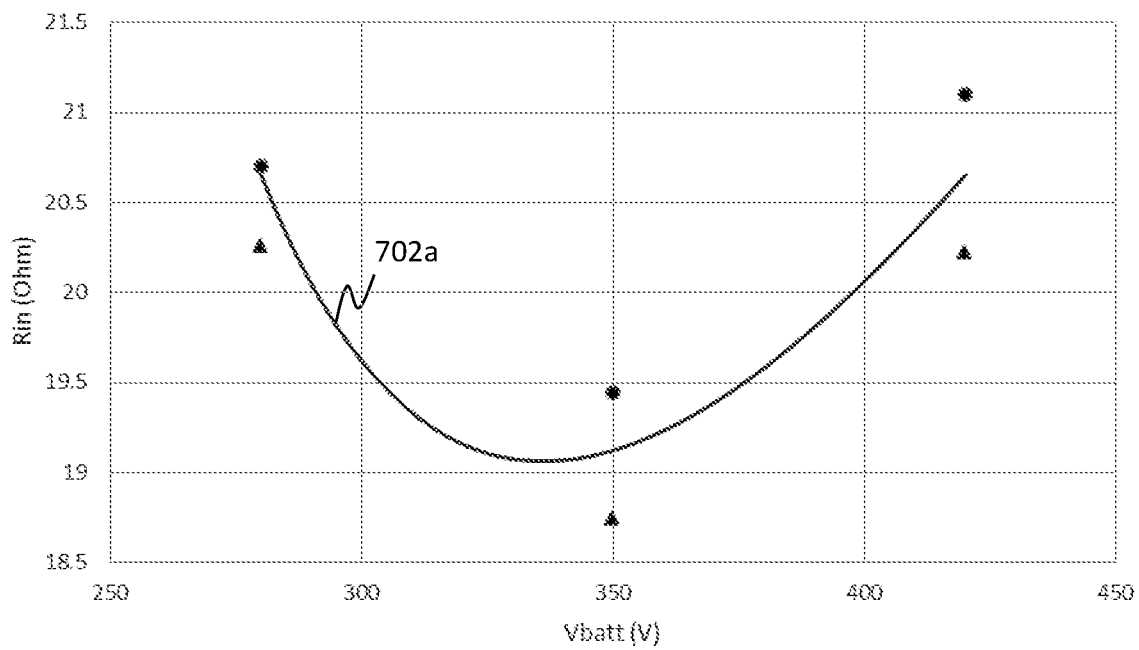
FIG. 7A is a plot of input resistance $R_{in}$ as a function of battery voltage $V_{batt}$ for receivers having various configurations of uncompensated and compensated reactances.
Figure 7B:
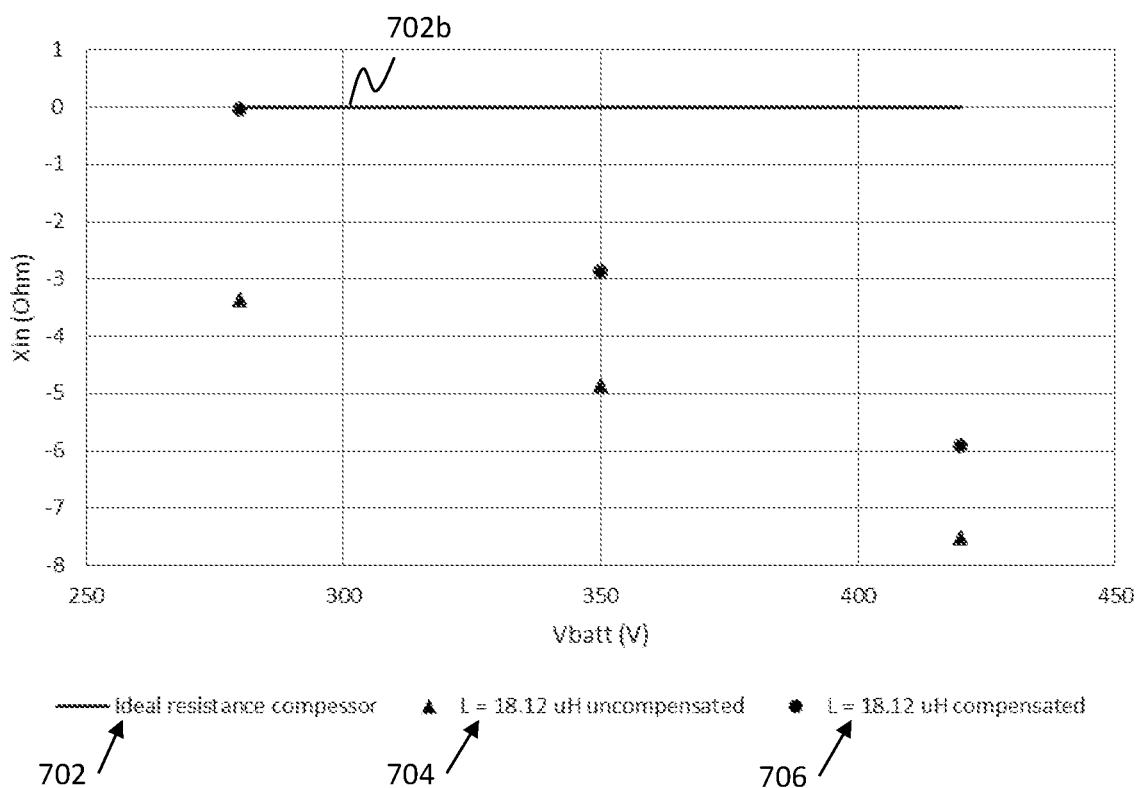
FIG. 7B is a plot of input reactance $X_{in}$ as a function of battery voltage $V_{batt}$.

FIG. 7A is a plot of input resistance $R_{in}$ (see FIG. 4) as a function of battery voltage $V_{batt}$ and FIG. 7B is a plot of input reactance $X_{in}$ as a function of battery voltage $V_{batt}$ for receivers having various configurations of uncompensated and compensated reactances. The solid lines 702a and 702b represent the expected resistance and reactance, respectively, of an ideal resistance compressor in which the input AC source (in this case, the wireless power transmitter) sees equivalent resistance of a smaller range than the equivalent load resistance. The resistance and reactance of uncompensated (or uncompensated) receiver 704 having the minimal inductance L4=18.12 uH is represented in triangle shaped (▲) data points in FIGS. 7A and 7B, respectively. The resistance and reactance of compensated receiver 706 having the minimal inductance L4=18.12 uH is represented in round shaped (●) data points in FIGS. 7A and 7B, respectively. As observed in the above data, at lower battery voltages (for example, at V=280 V), both the resistance and reactance of the compensated receiver 706 is closest to the ideal resistance compressor 702. Further, for the other battery voltage levels, the compensated receiver 706 is closer to the ideal resistance compressor 702 than the uncompensated system 704 having similar sized inductors L4. In other terms, some of the greatest benefit of the compensated receiver 706 is at the higher current levels of the receiver.

It is possible to select the battery voltage at which the resistance and reactance of the compensated receiver 706 are closest to the ideal resistance compressor 702. For example, one may select the higher battery voltage (i.e. 420 V in this example) instead of the lower battery voltage (i.e. 280 V in this example) as the point at which the resistance and reactance are closest to the ideal resistance compressor. In this case, the reactance of the compensated receiver would be positive at the lower battery voltage level.

Figure 7C:
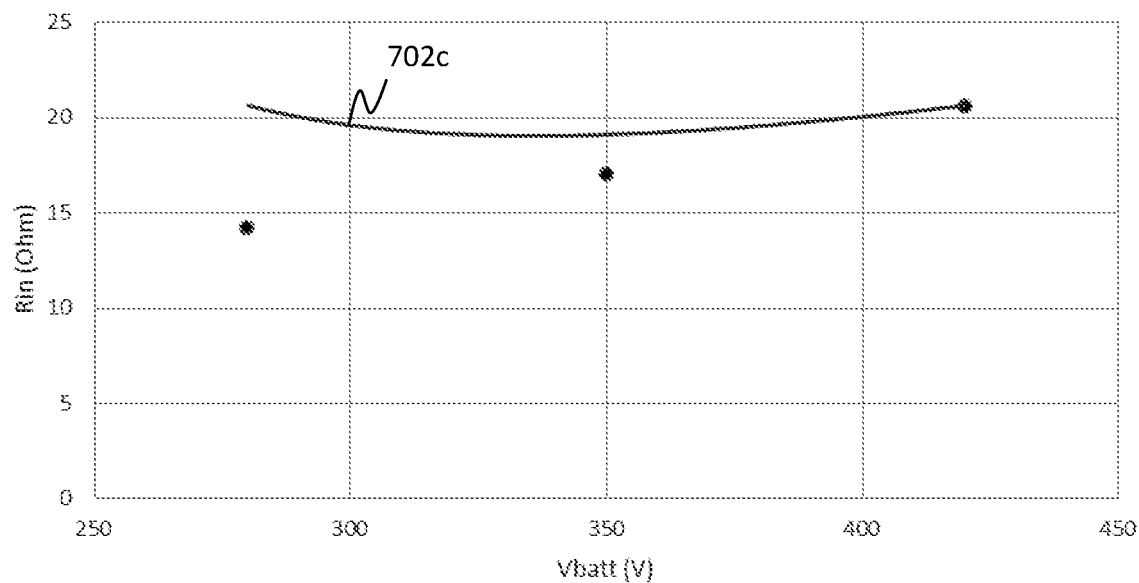
FIG. 7C is a plot of input resistance $R_{in}$ as a function of battery voltage $V_{batt}$ for receivers having various configurations of uncompensated and compensated reactances.
Figure 7D:
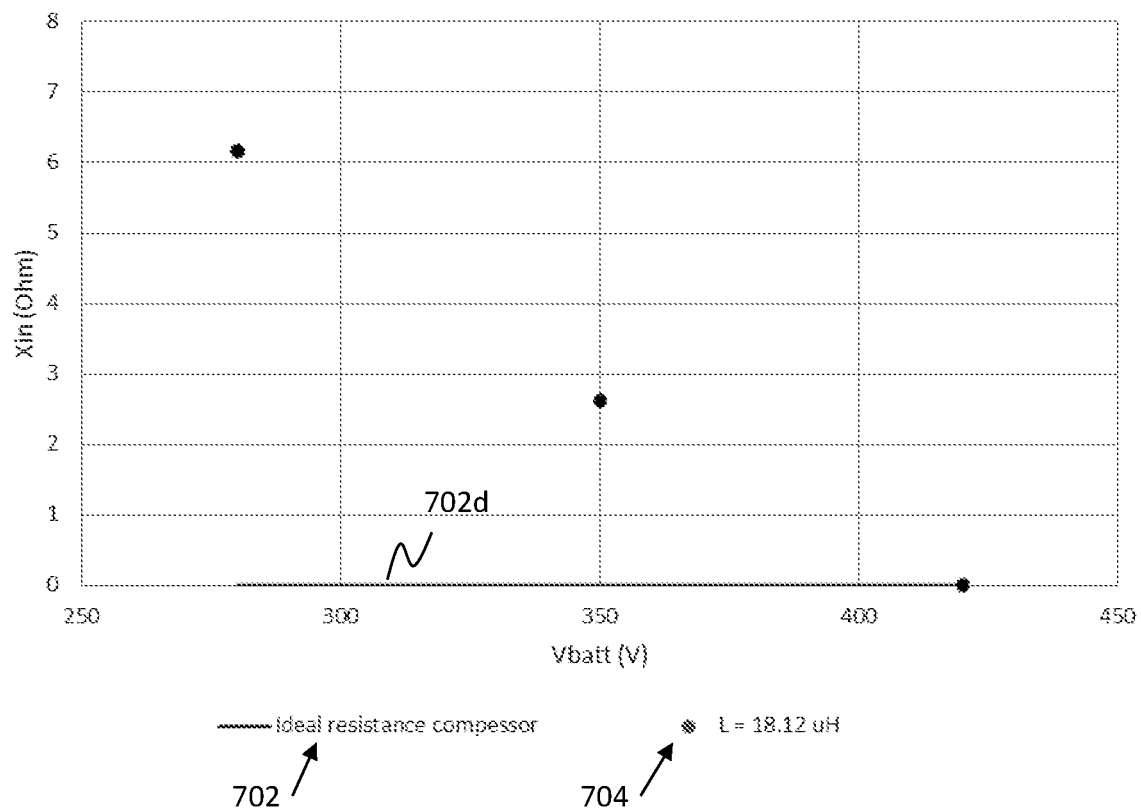
FIG. 7D is a plot of input reactance $X_{in}$ as a function of battery voltage $V_{batt}$.

FIG. 7C is a plot of input resistance $R_{in}$ (see FIG. 4) as a function of battery voltage $V_{batt}$ and FIG. 7D is a plot of input reactance $X_{in}$ as a function of battery voltage $V_{batt}$ for receiver having compensated reactances configured to receive energy with a fundamental frequency $f_0$=85 kHz. An exemplary compensated wireless power receiver can be designed with capacitances $C_{4A}$, $C_{4C}$=445 nF, $C_{4B}$, $C_{4D}$=75 nF, and inductors L4A, L4C, L4B, and L4D=18.12 uH. The solid lines 702c and 702d represent the expected resistance and reactance, respectively, of an ideal resistance compressor in which the input AC source (in this case, the wireless power transmitter) sees equivalent resistance of a smaller range than the equivalent load resistance. The resistance and reactance of compensated receiver having the minimal inductance L4=18.12 uH is represented in round shaped (●) data points in FIGS. 7C and 7D, respectively. One may select the higher battery voltage (i.e. 420 V in this example) instead of the lower battery voltage (i.e. 280 V in this example) as it is the point at which the resistance and reactance are closest to the ideal resistance compressor. It is understood that adjustment of the elements of the receiver C3A", C3A" (see FIG. 3) can be used to adjust the input reactance of the receiver at each of the battery voltages.

Example 2

An exemplary wireless power system is configured to operate at a fundamental frequency $f_0$ of approximately 6.78 MHz and transmit power of approximately 100 W to the load. The battery voltage $V_{batt}$ range for this load is from 20V to 30 V. In some embodiments, the input voltage Vin may be adjusted to keep the input power Pin constant. In some exemplary embodiments, the load can be a laptop or notebook computer. The following table outlines the values of associated with the components of an exemplary wireless power receiver 300. The expected impedance Z of the matching network is 3.24+j4.86 Ohms.

The data below illustrates the benefits of compensation in reactances of the wireless power receiver. For example, the imbalance of the current is reduced from 21.3% in the uncompensated receiver to 1.6% in the compensated receiver.

TABLE 4

Characteristics of exemplary uncompensated and compensated wireless power receivers configured to receive energy with a fundamental frequency $f_0$ = 6.78 kHz, at battery voltage $V_{batt}$ = 20-30 V.

|  | Uncompensated receiver L = 116 nH | Compensated receiver L = 116 nH |
|---|---|---|
| Currents $I_{4A}$, $I_{4C}$ (A) | 3.4 | 3.86 |
| Currents $I_{4B}$, $I_{4D}$ (A) | 4.33 | 3.92 |
| Δ Current (%) | 21.3% | 1.6% |
| Net resistance looking into branches $R_{4A, 4C}$ (Ohm) | 3.77 | 3.34 |
| Net reactance looking into branches $X_{4A, 4C}$ (Ohm) | 5.55 | 4.9 |
| Net resistance looking into branches $R_{4B, 4D}$ (Ohm) | 2.98 | 3.27 |
| Net reactance looking into branches $X_{4B, 4D}$ (Ohm) | −4.37 | −4.82 |
| Δ Net Resistance, ΔR (%) | 21% | 2.1% |
| Δ Net Reactance, ΔX (%) | 21.3% | 1.6% |
| Capacitances $C_{4A}$, $C_{4C}$ (nF) | 321.78 | 42 |
| Capacitances $C_{4B}$, $C_{4D}$ (nF) | 2.4 | 2.26 |
| Power $P_{4A}$, $P_{4C}$ (W) | 43.8 | 49.7 |
| Power $P_{4B}$, $P_{4D}$ (W) | 55.6 | 50.32 |
| Input Power $P_{in}$ (W) | 99.4 | 100.02 |
| Input resistance $R_{in}$ (Ohm) | 10.2 | 10.45 |
| Input reactance $X_{in}$ (Ohm) | −1.78 | −0.14 |
| Reactance $X_{4A}$, $X_{4C}$ (Ohm) | 4.87 | 4.39 |
| Reactance $X_{4B}$, $X_{4D}$ (Ohm) | −4.84 | −5.45 |
| Δ Reactance, ΔX (%) | 0.6% | 19.4% |

Note that references to any of the capacitor components described herein can refer to one or more capacitor or capacitance components electrically connected to one another. In the figures, multiple capacitor components may be represented by a single capacitor symbol for clarity.

Although the above discussion discloses various exemplary embodiments of the invention, it should be apparent that those skilled in the art can make various modifications that will achieve some of the advantages of the invention without departing from the true scope of the disclosure. All documents referenced herein are hereby incorporated by reference.

What is claimed is:

1. A wireless power receiver comprising:
a receiver resonator coupled to an impedance matching network, the impedance matching network having a first node and a second node;
coupled to the first node, a first branch having a first positive reactance and a second branch having a first negative reactance;
coupled to the second node, a third branch having a second positive reactance and a fourth branch having a second negative reactance;
a first rectifier having a first rectifier input coupled to the first branch;
a second rectifier having a second rectifier input coupled to the second branch;
a third rectifier having a third rectifier input coupled to the third branch; and
a fourth rectifier having a fourth rectifier input coupled to the fourth branch,
such that, during reception of electromagnetic energy by the wireless power receiver:
a first current is formed in the first branch and a second current is formed in the second branch, wherein a magnitude of the first current is within 30% of a magnitude of the second current, and
a third current is formed in the third branch and a fourth current is formed in the fourth branch, wherein a magnitude of the third current is within 30% of a magnitude of the fourth current, the currents oscillating at a fundamental frequency $f_0$ and at least one harmonic frequency $f_h$ of the fundamental frequency $f_0$,
wherein the absolute value of the first negative reactance is at least 4% different than the absolute value of the first positive reactance and the absolute value of the second negative reactance is at least 4% different than the absolute value of the second positive reactance.

2. The wireless power receiver of claim 1 wherein the absolute value of the first negative reactance is at least 10% different than the absolute value of the first positive reactance and the absolute value of the second negative reactance is at least 10% different than the absolute value of the second positive reactance.

3. A wireless power receiver comprising:
a receiver resonator coupled to an impedance matching network, the impedance matching network having a first node and a second node;
coupled to the first node, a first branch having a first positive reactance and a second branch having a first negative reactance;
coupled to the second node, a third branch having a second positive reactance and a fourth branch having a second negative reactance;
a first rectifier having a first rectifier input coupled to the first branch;
a second rectifier having a second rectifier input coupled to the second branch;
a third rectifier having a third rectifier input coupled to the third branch; and
a fourth rectifier having a fourth rectifier input coupled to the fourth branch,
such that, during reception of electromagnetic energy by the wireless power receiver:
a first current is formed in the first branch and a second current is formed in the second branch, wherein a magnitude of the first current is within 30% of a magnitude of the second current, and
a third current is formed in the third branch and a fourth current is formed in the fourth branch, wherein a magnitude of the third current is within 30% of a magnitude of the fourth current, the currents oscillating at a fundamental frequency $f_0$ and at least one harmonic frequency $f_h$ of the fundamental frequency $f_0$,
wherein:
the receiver is configured to deliver power to a battery with a voltage range $V_{low}$ to $V_{high}$, the battery coupled to an output of the first, second, third, and fourth rectifiers, and
for voltages $V_{low}$ to $0.5(V_{low}+V_{high})$, (i) the magnitude of the first current is within 30% of the magnitude of the second current and (ii) the magnitude of the third current is within 30% of the magnitude of the fourth current.

4. The wireless power receiver of claim 3 wherein, for voltage $V_{low}$, the magnitude of the first current is within 10% of the magnitude of the second current and the magnitude of the third current is within 10% of the magnitude of the fourth current.

5. The wireless power receiver of claim 3 wherein each rectifier has a positive output and a negative output, the positive outputs of the rectifiers joined to form a first output node coupled to the battery and the negative outputs of the rectifiers joined to form a second output node coupled to the battery.

6. The wireless power receiver of claim 5 wherein the first output node and the second output node are coupled to a smoothing capacitor, the smoothing capacitor configured to be coupled in parallel with the battery.

7. The wireless power receiver of claim 3 wherein the impedance matching network comprises a first tunable element coupled to the first node and a second tunable element coupled to the second node.

8. The wireless power receiver of claim 7 wherein the first tunable element and second tunable element each comprise a tunable capacitor.

9. The wireless power receiver of claim 3 wherein each of the first, second, third, and fourth rectifiers is a half bridge rectifier.

10. The wireless power receiver of claim 3 wherein the first rectifier and the third rectifier are coupled to form a full bridge rectifier, and the second and fourth rectifiers are coupled to form a full bridge rectifier.

11. The wireless power receiver of claim 3 wherein the first, second, third, and fourth rectifiers are either diode rectifiers or switching rectifiers.

12. The wireless power receiver of claim 3 wherein the fundamental frequency $f_0$ is 85 kHz.

13. A wireless power receiver comprising:
a receiver resonator coupled to an impedance matching network, the impedance matching network having a first node and a second node;
coupled to the first node, a first branch having a first positive reactance and a second branch having a first negative reactance;
coupled to the second node, a third branch having a second positive reactance and a fourth branch having a second negative reactance;
a first rectifier having a first rectifier input coupled to the first branch;

a second rectifier having a second rectifier input coupled to the second branch;
a third rectifier having a third rectifier input coupled to the third branch; and
a fourth rectifier having a fourth rectifier input coupled to the fourth branch,
such that, during reception of electromagnetic energy by the wireless power receiver:
a first current is formed in the first branch and a second current is formed in the second branch, wherein a magnitude of the first current is within 30% of a magnitude of the second current, and
a third current is formed in the third branch and a fourth current is formed in the fourth branch, wherein a magnitude of the third current is within 30% of a magnitude of the fourth current, the currents oscillating at a fundamental frequency $f_0$ and at least one harmonic frequency $f_h$ of the fundamental frequency $f_0$,
wherein the first branch and the third branch each comprise a first inductor and a first capacitor, an absolute value of a reactance value of the first inductor being greater than an absolute value of a reactance value of the first capacitor.

14. The wireless power receiver of claim 13 wherein the second branch and the fourth branch each comprise a second inductor and a second capacitor, an absolute value of a reactance value of the second inductor being less than an absolute value of a reactance value of the second capacitor.

15. The wireless power receiver of claim 14 wherein an inductance value of the first inductor is approximately equal to an inductance value of the second inductor.

16. A vehicle charging system comprising:
a wireless power receiver comprising:
a receiver resonator coupled to an impedance matching network, the impedance matching network having a first node and a second node;
coupled to the first node, a first branch having a first positive reactance and a second branch having a first negative reactance;
coupled to the second node, a third branch having a second positive reactance and a fourth branch having a second negative reactance;
a first rectifier having a first rectifier input coupled to the first branch;
a second rectifier having a second rectifier input coupled to the second branch;
a third rectifier having a third rectifier input coupled to the third branch; and
a fourth rectifier having a fourth rectifier input coupled to the fourth branch,
such that, during reception of electromagnetic energy by the wireless power receiver:
a first current is formed in the first branch and a second current is formed in the second branch, wherein a magnitude of the first current is within 30% of a magnitude of the second current, and
a third current is formed in the third branch and a fourth current is formed in the fourth branch, wherein a magnitude of the third current is within 30% of a magnitude of the fourth current, the currents oscillating at a fundamental frequency $f_0$ and at least one harmonic frequency $f_h$ of the fundamental frequency $f_0$; and a vehicle battery coupled to a first output node and a second output node, the first output node formed from an output of the first rectifier and an output of the third rectifier and the second output node formed from an output of the second rectifier and an output of the fourth rectifier.

17. The vehicle charging system of claim 16 wherein the magnitude of the first current is within 10% of the magnitude of the second current and the magnitude of the third current is within 10% of the magnitude of the fourth current.

18. The vehicle charging system of claim 16 wherein the absolute value of the first negative reactance is at least 4% different than the absolute value of the first positive reactance and the absolute value of the second negative reactance is at least 4% different than the absolute value of the second positive reactance.

19. The vehicle charging system of claim 16 wherein:
the first branch and the third branch each comprise a first inductor and a first capacitor, an absolute value of a reactance value of the first inductor being greater than an absolute value of a reactance value of the first capacitor; and
the second branch and the fourth branch each comprise a second inductor and a second capacitor, an absolute value of a reactance value of the second inductor being less than an absolute value of a reactance value of the second capacitor.

20. A wireless power receiver comprising:
a receiver resonator coupled to an impedance matching network, the impedance matching network having a first node and a second node;
coupled to the first node, a first branch having a first positive reactance and a second branch having a first negative reactance;
coupled to the second node, a third branch having a second positive reactance and a fourth branch having a second negative reactance;
a first rectifier having a first rectifier input coupled to the first branch;
a second rectifier having a second rectifier input coupled to the second branch;
a third rectifier having a third rectifier input coupled to the third branch; and
a fourth rectifier having a fourth rectifier input coupled to the fourth branch,
such that, during reception of electromagnetic energy by the wireless power receiver:
a first current is formed in the first branch and a second current is formed in the second branch, wherein a magnitude of the first current is within 30% of a magnitude of the second current, and
a third current is formed in the third branch and a fourth current is formed in the fourth branch, wherein a magnitude of the third current is within 30% of a magnitude of the fourth current, the currents oscillating at a fundamental frequency $f_0$ and at least one harmonic frequency $f_h$ of the fundamental frequency $f_0$,
wherein a first difference between (a) an absolute value of the first positive reactance and (b) an absolute value of the first negative reactance is approximately equal to a second difference between (i) an absolute value of the second positive reactance and (ii) an absolute value of the second negative reactance.

* * * * *